United States Patent [19]
Pronk et al.

[11] Patent Number: 5,466,495
[45] Date of Patent: Nov. 14, 1995

[54] METHOD OF MANUFACTURING A MAGNETIC HEAD

[75] Inventors: Franciscus A. Pronk; Thijs W. Bril; Peter S. A. Knapen; Arie H. Van Heeren; Laurens J. Rhijnsburger, all of Eindhoven, Netherlands

[73] Assignee: U.S. Philips Corporation, New York, N.Y.

[21] Appl. No.: 148,813

[22] Filed: Nov. 8, 1993

[30] Foreign Application Priority Data

Nov. 19, 1992 [EP] European Pat. Off. ............ 92203426

[51] Int. Cl.⁶ .................................................. B05D 3/06
[52] U.S. Cl. .................. 427/576; 427/127; 427/130; 427/131; 427/255.7; 427/331; 427/419.2; 427/419.3; 427/419.7; 427/579; 427/585
[58] Field of Search .................. 427/127, 579, 427/585, 248.1, 130, 131, 132, 255.7, 331, 419.2, 419.3, 419.7, 576

[56] References Cited

U.S. PATENT DOCUMENTS 4,789,910 12/1988 Omuka et al. .................... 360/113

FOREIGN PATENT DOCUMENTS 62-146418 6/1987 Japan .

*Primary Examiner*—Bernard Pianalto
*Attorney, Agent, or Firm*—John C. Fox

[57] ABSTRACT

Method of manufacturing a magnetic head, in which a transducing structure (1) comprising at least a transducing element (5) is formed on a substrate (3) by means of a thin-film technique, after which a thick film coating (23) is provided on an uneven surface (21), remote from the substrate, of the structure formed. The thick film has a thickness which is minimally equal to the distance between an area (21A) of said surface which is farthest remote from the substrate and an area (21B) which is most proximate to the substrate and is deposited on said surface by means of PE-CVD.

24 Claims, 2 Drawing Sheets

METHOD OF MANUFACTURING A MAGNETIC HEAD

BACKGROUND OF THE INVENTION

The invention relates to a method of manufacturing a magnetic head, in which a transducing structure comprising at least a transducing element is formed on a substrate by means of a thin-film technique and in which a coating is provided on an uneven surface, remote from the substrate, of the structure formed.

Such a method is known from JP-A 62-146418 (herewith incorporated by reference). In the known method a protective coating of $Al_2O_3$ is provided by means of sputtering after a thin-film structure comprising an inductive transducing element and a magnetic circuit with a transducing gap has been formed. A drawback of the known method is that the rate at which $Al_2O_3$ can be deposited on said structure is limited. Since a thick coating is generally required, this leads to a relatively long deposition time which, from a production-technical point of view, is unfavourable because this results in a long manufacturing time of the magnetic head.

OBJECTS AND SUMMARY OF THE INVENTION

It is an object of the invention to improve the method described in the opening paragraph in such a way that the time of manufacturing the magnetic head can be reduced.

To this end the method according to the invention is characterized in that the surface of the transducing structure remote from the substrate is provided by means of PE-CVD with a thick film forming the coating and having a thickness which is minimally equal to the distance between an area of said surface which is farthest remote from the substrate and an area which is most proximate to the substrate. The transducing structure may be provided with an inductive transducing element and/or a magnetoresistive transducing element.

By using a Plasma Enhanced Chemical Vapour Deposition process (PE-CVD process) for forming the coating on the transducing structure of a magnetic head, the manufacturing time can be considerably reduced as compared with the time required for the known method. As compared with sputtering, PE-CVD has the additional advantage that sharp or stepped surface portions of the transducing structure are better coated. The thick film formed by means of PE-CVD generally has a thickness of between 5 µm and 50 µm, dependent on the surface unevenness of the transducing structure.

It is to be noted that it is known per se to use a PE-CVD process for providing a thin film on a surface. In this connection reference is made to U.S. Pat. No. 4,789,910 (herewith incorporated by reference).

An embodiment of the method according to the invention is characterized in that, prior to providing the coating, a thin shielding layer is formed on the transducing structure, on which layer the thick film is provided by means of PE-CVD. The shielding layer provided on the transducing structure prevents the gases used during the PE-CVD process from coming into contact with the materials of the transducing structure and thus prevents unwanted chemical reactions and attack of the transducing structure. The shielding layer which has a composition which is resistant to the gases being present during PE-CVD may also enhance the adhesion of the thick film to the transducing structure.

An embodiment of the method according to the invention is characterized in that at least one of the materials $SiO_2$, $Al_2O_3$, $Si_3N_4$, $TaO_2$ is deposited by means of PE-CVD for forming the thick film. It has been found that a silicon oxide nitride ($SiO_xN_y$) is favourable as a deposition material for forming the thick film by means of PE-CVD.

In this range of materials, $SiO_2$ is preferred due to its favourable process properties and due to the great hardness and wear resistance of the deposited thick film. The latter is particularly important to inhibit hollowing during the formation of a head face on a magnetic head to be manufactured and during use of the manufactured magnetic head.

An embodiment of the method according to the invention is characterized in that at least one of the electrically non-conducting materials $SiO_2$, $Al_2O_3$, $ZrO_2$ is used for forming the shielding layer. The thin shielding layer having a maximum thickness of several microns, but preferably smaller than 1 µm, can be formed by means of, for example a sputtering process.

An embodiment of the method according to the invention is characterized in that PE-CVD is performed at a process temperature between 100° C. and 300° C. This relatively low temperature prevents the substrate and the transducing structure from being subjected to a heavy thermal load so that large expansions of material during PE-CVD are inhibited. This has the advantage that there is only limited shrinkage during cooling so that, in contrast to what was expected, no harmful stress is generated in the thick film, which results in a stable coating without any cracks. Further favourable process parameters are: a RF frequency of 375 Hz and a $SiH_4/N_2O$ gas flow in which the ratio between $SiH_4$ and $N_2O$ is between 1:10 and 1:30. A mixing frequency of 13.5 MHz may be used.

In order to provide the magnetic head to be manufactured with electric connection means, an embodiment is characterized in that an electrically conducting connection element is provided prior to forming the coating, while the shielding layer, when being formed, is also provided on the connection element, whereafter the shielding layer thus formed is coated with the thick film during PE-CVD. The connection element may be a conducting strip or layer of, for example copper having a thickness of several tens of microns. By providing a shielding layer on the connection element, a possible reaction between the electrically conducting material of the connection element and the gas or gases present during the PE-CVD process is prevented. The shielding layer may also be used as an adhesive layer.

To protect the transducing structure of the magnetic head to be manufactured, an embodiment of the method according to the invention is characterized in that, after planing, a protective element is secured to the thick film provided by means of PE-CVD. Planing may be performed, for example with $CeO_2$. A thin adhesive layer may be used as a securing means between the coating and the protective element.

An embodiment of the method according to the invention is characterized in that a portion of the thick film situated opposite the connection element is removed during planing for forming an electric connection face. In accordance with this embodiment, an electric connection face is obtained in an efficient manner, without extra process steps being required.

The invention also relates to a magnetic head manufactured by means of the method according to the invention. The magnetic head according to the invention is characterized in that a PE-CVD coating is present on the transducing structure. A protective element may be present on the PE-CVD coating. A magnetic head which has a very high wear resistance is obtained if the PE-CVD coating at least substantially comprises $SiO_2$.

BRIEF DESCRIPTION OF THE DRAWINGS

These and other aspects of the invention will be apparent from the embodiments described hereinafter and elucidated with reference to the drawings, in which.

DESCRIPTION OF THE PREFERRED EMBODIMENTS

Figure 1:
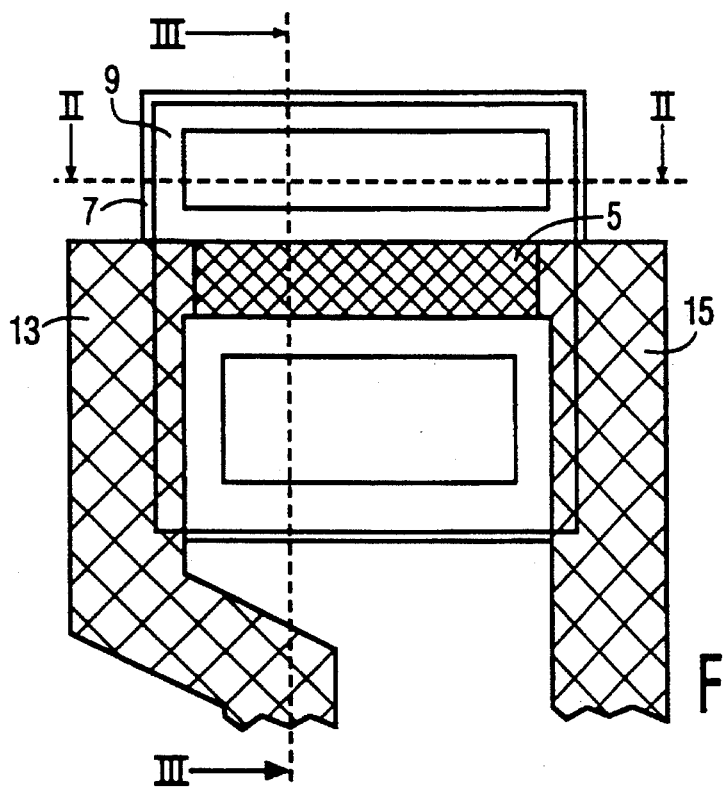
FIG. 1 is a plan view of a transducing structure.
Figure 2:
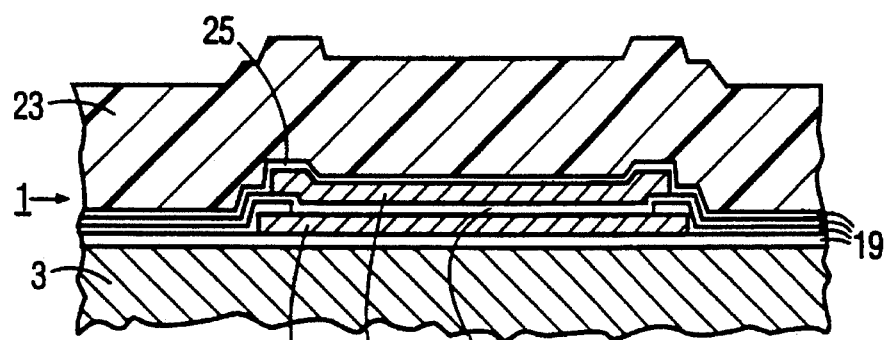
FIG. 2 is a cross-section taken on the line II—II in FIG. 1, in which the transducing structure has a coating provided by means of an embodiment of the method according to the invention.
Figure 4:
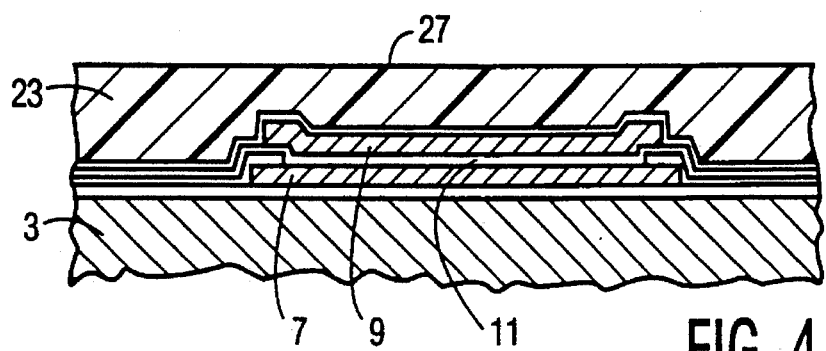
FIG. 4 is a cross-section taken on the line II—II showing the transducing structure according to FIGS. 2 and 3 after the coating has been planed.
Figure 3:
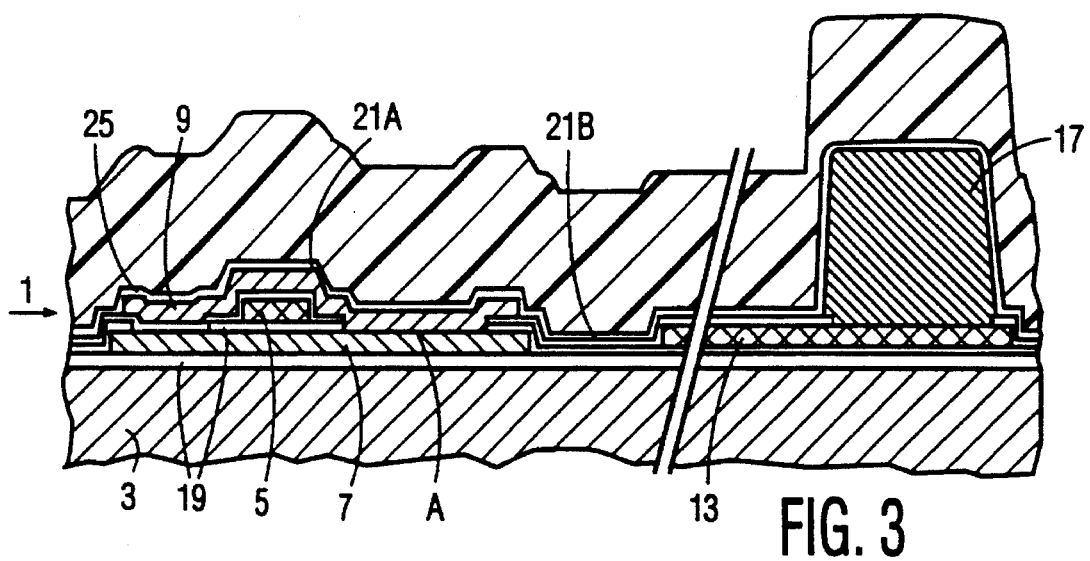
FIG. 3 is a cross-section taken on the line III—III in FIG. 1, in which the transducing structure is provided with the coating.
Figure 5:
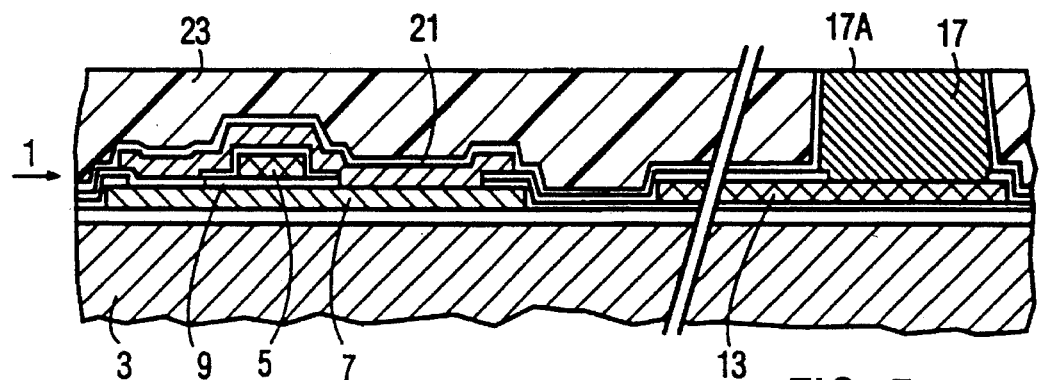
FIG. 5 is a cross-section taken on the line III—III showing the structure according to FIG. 4
Figure 6:
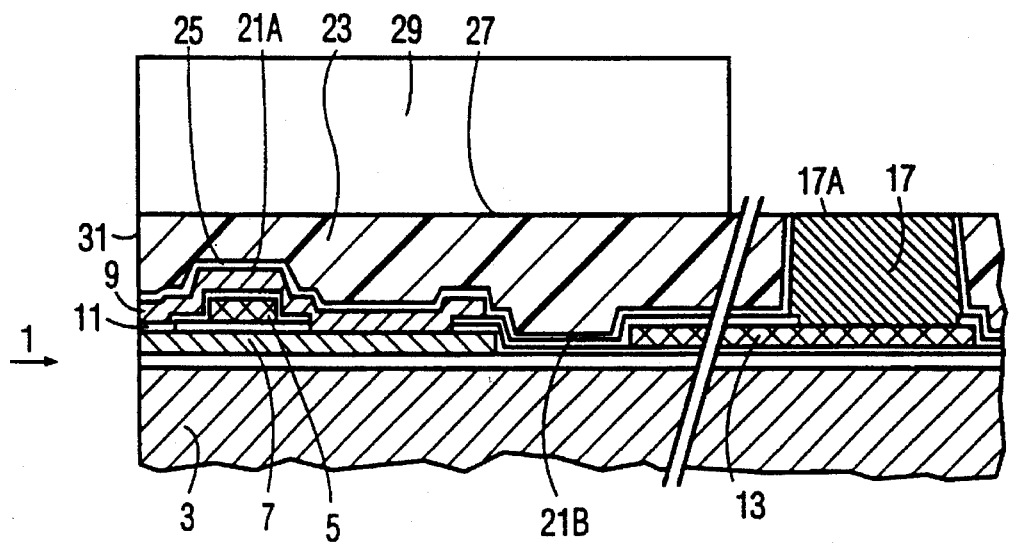
FIG. 6 is a cross-section taken on the line III—III showing an embodiment of the magnetic head according to the invention.

The transducing structure 1 shown in the Figures is provided on a substrate 3 by means of thin-film techniques such as vacuum deposition, etching, lithography. In this embodiment the substrate 3 is formed from a non-magnetic material, for example $Al_2O_3$/TiC. However, if desired, the substrate may be magnetic and formed, for example from a ferrite. In this embodiment the transducing structure 1 is provided with an inductive transducing element 5 and a magnetic yoke comprising a first flux guide 7 and a second flux guide 9. A non-magnetic transducing gap 11 of, for example $SiO_2$ extends between the flux guides 7 and 9 which are formed from, for example NiFe. The flux guides 7 and 9 are magnetically interconnected in an area A. The transducing element 5 is electrically connected at two ends to electrically conducting layers 13 and 15 which make electric contact with copper connection elements 17. Instead of or additionally to the inductive transducing element 5, the transducing structure may be provided with a magnetoresistive element. In the embodiment shown electrically insulating layers 19 of, for example $SiO_2$ are provided between various layers.

As a result of the manufacturing technique used, the transducing structure 1 has an uneven surface 21 remote from the substrate, with an area, or roof, 21A being farthest remote from the substrate 3 and an area, or trough, 21B being most proximate to the substrate 3. In accordance with the inventive method the transducing structure 1 is planarized by providing a coating 23 by means of a PE-CVD process, which coating has a thickness which is at least equal to the distance between the areas 21A and 21B, and by subsequently planing this coating. In this embodiment a thick film of $SiO_2$ forming the coating 23 is deposited. Before the PE-CVD is started, a thin oxidic shielding layer 25, of $Al_2O_3$ in this embodiment, having a thickness of 0.25 microns is deposited by means of, for example a sputtering process.

In this embodiment the shielding layer 25 and the coating 23 is provided on the transducing structure 1 as well as on the connection elements 17. The shielding layer of $Al_2O_3$ also serves as an adhesive layer between the copper of the connection elements 17 and the $SiO_2$ coating.

A thick film forming the coating 23 can be provided by means of known PE-CVD apparatus. The following parameters were used in an experiment for forming the thick film having a thickness of 30 μm in this embodiment: a RF frequency of 375 kHz, a $SiH_4/H_2O$ gas flow in a ratio of 1:20; a process temperature of 225° C. It was surprisingly found that with these parameters, and generally with the parameters within the limits stated in the introductory part of this description, the thick film formed was free from cracks and did not have any crumbling.

The coating 23 formed is subsequently provided with a plane surface 27 for which, for example $CeO_2$ can be used as a polishing agent. When the coating 23 is being planarized, the connection elements 27 are cut through so as to form connection faces 17a. To protect the transducing structure, a protective element 29 is glued onto the surface 27 of the coating 23. The assembly obtained is subsequently provided with a head face 31 by grinding and/or polishing. It was surprisingly found that, due to the favourable wear resistance of the coating 23, hollowing was prevented entirely or at least to a great extent during formation of the head face 31.

The magnetic head thus formed in accordance with the invention is suitable for cooperating with a magnetic medium, particularly a magnetic tape or disc.

We claim:

1. A method of manufacturing a magnetic head, comprising forming at least a thin-film structure including a transducing element on a substrate, resulting in an uneven surface of the structure formed, remote from the substrate, and coating the uneven surface, characterized in that the coating is a thick film provided by PE-CVD, and having a thickness which is minimally equal to the distance between an area of said surface which is farthest remote from the substrate and an area which is most proximate to the substrate.

2. A method as claimed in claim 1, characterized in that, prior to providing the coating, a thin shielding layer is formed on the transducing structure, and the thick film is provided on the layer.

3. A method as claimed in claim 2, characterized in that the thick film comprises at least one of the materials selected from the group consisting of $SiO_2$, $Al_2O_3$, $Si_3N_4$, and $TaO_2$.

4. A method as claimed in claim 3, characterized in that the shielding layer comprises at least one of the electrically non-conducting materials selected from the group consisting of $SiO_2$, $Al_2O_3$, and $ZrO_2$.

5. A method as claimed in claim 4, characterized in that PE-CVD is performed at a temperature between 100° C. and 300° C.

6. A method as claimed in claim 4, characterized in that, after coating, the thick film is planarized.

7. A method as claimed in claim 2, characterized in that prior to providing the shielding layer, an electrically conducting connection element is provided, and the shielding layer is provided on the connection element.

8. A method as claimed in claim 7, characterized in that, after coating, the thick film is planarized.

9. A method as claimed in claim 7, characterized in that a portion of the thick film situated opposite the connection element is removed during planarizing for forming an electric connection face.

10. A method as claimed in claim 2, characterized in that the thick film comprises a silicon oxide-nitride.

11. A method as claimed in claim 2, characterized in that PE-CVD is performed at a temperature between 100° C. and 300° C.

12. A method as claimed in claim 2, characterized in that, after coating, the thick film is planarized.

13. A method as claimed in claim 1, characterized in that the thick film comprises at least one of the materials selected from the group consisting of $SiO_2$, $Al_2O_3$, $Si_3N_4$, and $TaO_2$.

14. A method as claimed in claim 13, characterized in that PE-CVD is performed at a temperature between 100° C. and 300° C.

15. A method as claimed in claim 13, characterized in that, after coating, the thick film is planarized.

16. A method as claimed in claim 1, characterized in that the thick film comprises a silicon oxide-nitride.

17. A method as claimed in claim 16, characterized in that PE-CVD is performed at a temperature between 100° C. and 300° C.

18. A method as claimed in claim 16, characterized in that, after coating, the thick film is planarized.

19. A method as claimed in claim 16, characterized in that the shielding layer comprises at least one of the electrically non-conducting materials selected from the group consisting of $SiO_2$, $Al_2O_3$, and $ZrO_2$.

20. A method as claimed in claim 1, characterized in that PE-CVD is performed at a temperature between 100° C. and 300° C.

21. A method as claimed in claim 20, characterized in that, after coating, the thick film is planarized.

22. A method as claimed in claim 1, characterized in that, after coating, the thick film is planarized.

23. A method as claimed in claim 22, characterized in that a portion of the thick film situated opposite the connection element is removed during planarizing for forming an electric connection face.

24. A method as claimed in claim 22, characterized in that, after planarization, a protective element is secured to the thick film.

* * * * *